(12) United States Patent
Carruthers

(10) Patent No.: US 11,217,442 B2
(45) Date of Patent: Jan. 4, 2022

(54) METHOD OF DEPOSITING A SIN FILM

(71) Applicant: SPTS TECHNOLOGIES LIMITED, Newport (GB)

(72) Inventor: Mark Carruthers, Newport Gwent (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 16/394,369

(22) Filed: Apr. 25, 2019

(65) Prior Publication Data

US 2019/0333752 A1 Oct. 31, 2019

(30) Foreign Application Priority Data

Apr. 26, 2018 (GB) ..................... 1806865

(51) Int. Cl.
| | | |
|---|---|---|
| *H01L 21/02* | (2006.01) | |
| *H01L 27/12* | (2006.01) | |
| *H01L 27/32* | (2006.01) | |
| *H01L 51/00* | (2006.01) | |
| *H01L 51/56* | (2006.01) | |

(52) U.S. Cl.
CPC .... *H01L 21/0217* (2013.01); *H01L 21/02274* (2013.01); *H01L 27/1262* (2013.01); *H01L 27/3244* (2013.01); *H01L 51/0097* (2013.01); *H01L 51/56* (2013.01)

(58) Field of Classification Search
CPC ........... H01L 21/0217; H01L 21/02274; H01L 27/1262; H01L 27/3244; H01L 51/0097; H01L 51/56; H01L 51/5253; H01L 27/3272; H01L 51/5246; H01L 2227/323; C23C 16/46; C23C 16/52; C23C 16/345; C23C 16/455; C23C 16/50
See application file for complete search history.

(56) References Cited

U.S. PATENT DOCUMENTS

| | | |
|---|---|---|
| 6,929,831 B2 | 8/2005 | Patel et al. |
| 7,019,352 B2 | 3/2006 | Udayakumar et al. |
| 9,269,923 B2 | 2/2016 | Choi et al. |
| (Continued) | | |

FOREIGN PATENT DOCUMENTS

| | | |
|---|---|---|
| JP | 2012036460 A | 2/2012 |
| JP | 2012209209 A | 10/2012 |
| WO | WO2006007313 A2 | 1/2006 |

OTHER PUBLICATIONS

Raman and FTIR Studies on PECVD Grown Ammonia-Free Amorphous Silicon Nitride Thin Films for Solar Cell Applications. Conference Papers in Energy vol. 2013, Article ID 837676, 4 pages.

(Continued)

*Primary Examiner* — Mohammed R Alam
(74) *Attorney, Agent, or Firm* — Hodgson Russ LLP

(57) ABSTRACT

A method of depositing a SiN film onto a flexible substrate includes providing the flexible substrate, and depositing the SiN film onto the flexible substrate in a plasma enhanced chemical vapour deposition (PECVD) process using $SiH_4$, $N_2$ and $H_2$, in which the temperature of the substrate is 200° C. or less and $SiH_4$ is introduced into the PECVD process at a flow rate of greater than 100 sccm.

20 Claims, 10 Drawing Sheets

(56) References Cited

U.S. PATENT DOCUMENTS

| | | |
|---|---|---|
| 2008/0070385 A1 | 3/2008 | Won et al. |
| 2008/0254203 A1* | 10/2008 | Zhou .................. C23C 16/345 427/74 |
| 2011/0195203 A1 | 8/2011 | Fujinami |
| 2012/0000512 A1* | 1/2012 | Shimizu .............. H01L 31/0463 136/251 |
| 2012/0202346 A1* | 8/2012 | Sakanaka ........ H01L 21/823412 438/666 |
| 2012/0301633 A1 | 11/2012 | Kikuchi |
| 2015/0175471 A1* | 6/2015 | Huang ................ B65H 18/103 428/120 |
| 2018/0277376 A1* | 9/2018 | Wang ..................... H01L 28/60 |

OTHER PUBLICATIONS

EPO, European Search Report for EP Application No. 19171201, dated Sep. 27, 2019.

* cited by examiner

| Test | Description |
|---|---|
| 1 |  |
| 2 |  |
| 3 |  |
| 4 |  |
| 5 |  |
| 6 | -- |

METHOD OF DEPOSITING A SIN FILM

BACKGROUND

This invention relates to a method of depositing a SiN film, with particular reference to the deposition of a SiN film on a flexible substrate such as an Active Matrix Organic Light Emitting Diode (AMOLED) device. The invention relates also to substrates having SiN films deposited thereon by this method.

It is well known to deposit films on a wide range of substrates to provide a desired property or to perform a desired function. For example, a film may be deposited to provide a protective function, such as to prevent or inhibit scratching or ingress of moisture. However, it is difficult to provide a satisfactory solution when the substrate is a flexible substrate which is intended to be bent, folded or flexed during use. This is because the deposited film must also be able to withstand being bent, folded or flexed without suffering mechanical failure such as cracking. Of course, the deposited film must be capable of performing its desired function despite being subjected to these distortions during use.

This is an increasingly important problem in the manufacture of semiconductor products. For example, Thin Film Encapsulation (TFE) is required on Active Matrix Organic Light Emitting Diode (AMOLED) devices. These devices are typically used as touch screen interfaces for mobile devices, such as cell phones and tablets. Next generation products require a screen that can withstand being bent/folded or flexed without cracking. To accommodate this functionality, it is desired that the TFE film has a high degree of flexibility and superior moisture barrier properties. It is known to deposit inorganic films such as $SiO_2$, $Al_2O_3$ and SiN (silicon nitride) TFE films for this purpose. SiN is deposited using Plasma Enhanced Chemical Vapour Deposition (PECVD) manufacturing techniques with a $NH_3$ based process chemistry (using a mixture of $SiH_4$, $NH_3$, and $N_2$). $NH_3$ based films traditionally have favourable flexibility, but suffer from inferior properties, such as moisture ingress, over time. Other inorganic TFE films such as $SiO_2$ and $Al_2O_3$ have this drawback as well. As such, additional layer(s) are required to protect the SiN film from moisture within the atmosphere. The additional layers are usually of an organic polymer, and are typically interleaved between PECVD films. This prior art arrangement is shown in FIG. 1, where a plurality of interleaved organic polymer layers 10 and SiN layers 12 are disposed on a flexible OLED substrate 14. The use of multiple interleaved layers of this type increases the diffusion length for moisture. This is illustrated in FIG. 1, where the SiN layers 12 have pinhole defects 16 which allow the passage of water therethrough. It can be seen that the presence of the polymer layers 10 increases the diffusion path for moisture from the outside atmosphere to the OLED substrate where corrosion would eventually prevent the device from working. However, it is a significant manufacturing drawback to deposit multiple interleaving layers of two different materials in order to form a moisture barrier.

FIG. 2 shows the reduction in Water Vapour Transmission Rate (WVTR) required for OLED devices, compared to TFT (thin film transistor) and LCD (liquid crystal display)/EPD (electronic paper display) devices (in units of $g/m^2$/day of exposure to water vapour). The data show that for OLED devices, a WVTR that is at least two decades lower than for TFT products and at least four decades lower than for LCD/ECD products is required. For flexible OLED devices, this demanding WVTR requirement means that there is a significant need for an inorganic barrier film which is both moisture resistant and flexible.

SUMMARY

The present invention, in at least some of its embodiments, addresses the above described problems and needs. Although the invention is particularly directed towards OLEDs and other flexible substrates that require a moisture resistant barrier film, the invention is applicable more generally to flexible substrates that require a protective film.

In the description provided below, parameters such as flow rates and temperatures are discussed in relation to certain bounds, such as lower limits, upper limits and ranges of the parameters. For the avoidance of doubt, in respect of any such parameter, the present invention also includes within its scope any combination of these bounds.

According to a first aspect of the invention there is provided a method of depositing a SiN film onto a flexible substrate comprising the steps of:

providing the flexible substrate; and depositing the SiN film onto the flexible substrate in a plasma enhanced chemical vapour deposition (PECVD) process using $SiH_4$, $N_2$ and $H_2$, in which the temperature of the substrate is 200° C. or less and $SiH_4$ is introduced into the PECVD process at a flow rate of greater than 100 sccm.

Surprisingly, it has been found that SiN films of this type can exhibit excellent flexibility whilst being deposited at advantageously low temperatures. The SiN films can exhibit improved moisture resistance and therefore have application as flexible, moisture resistant barrier layers. A further advantage is that it is readily possible to control the stress of the deposited SiN film.

The flexible substrate may comprise an Organic Light Emitting Diode (OLED). The low deposition temperature employed by the present invention is extremely advantageous in these embodiments, because of the limited temperature budget for deposition onto substrates of this kind. It is also extremely advantageous that the SiN film exhibits improved moisture resistance properties which are needed for OLED devices. The flexible substrate may be an AMOLED device.

The invention may be applied to other flexible substrates. For example, the flexible substrate may be a flexible solar cell.

$SiH_4$ may be introduced into the PECVD process at a flow rate of greater than 200 sccm. Generally, the flow rate of $SiH_4$ is less than 1000 sccm. $SiH_4$ may be introduced into the PECVD process at a flow rate in the range 270 to 370 sccm. Preferably, $SiH_4$ is introduced into the PECVD process at a flow rate in the range 290 to 320 sccm.

$H_2$ may be introduced into the PECVD process at a flow rate in the range 300 to 400 sccm. Preferably, $H_2$ is introduced into the PECVD process at a flow rate in the range 350 to 370 sccm.

$N_2$ may be introduced into the PECVD process at a flow rate of greater than 2000 sccm. Generally, the flow rate of $N_2$ is less than 6000 sccm. $N_2$ may be introduced into the PECVD process at a flow rate in the range 3500 to 4750 sccm. Preferably, $N_2$ is introduced into the PECVD process at a flow rate in the range 4100 to 4400 sccm.

The temperature of the flexible substrate may be 150° C. or less. Generally, the temperature of the flexible substrate is 75° C. or more. The temperature of the flexible substrate may be in the range 90 to 120° C. Preferably, the temperature of the flexible substrate is in the range 95 to 105° C.

The SiH$_4$, N$_2$ and H$_2$ used in the PECVD process act as reaction gases in a SiN film forming process. The PECVD process is performed in a mixture of gases, and typically this mixture of gases consists of SiH$_4$, N$_2$ and H$_2$. Alternatively, the mixture of gases may comprise SiH$_4$, N$_2$ and H$_2$. In other words, one or more additional gases may be used. For example, at least one diluent gas (ie, a gas that does not act as a reaction gas in the SiN film forming process) may be used together with SiH$_4$, N$_2$ and H$_2$. The diluent gas may be a Noble gas such as Argon or Helium. For the avoidance of doubt, the term 'gas' as used herein includes within its scope any gas phase species playing a role in the PECVD process, including a vapour emanating from a liquid.

The SiN film may act as a passivation layer or an encapsulation layer. The SiN film may act as a moisture resistant passivation layer.

In principle, more than one layer of SiN film may be deposited onto the flexible substrate. However, it is considered an advantage of the invention that a single layer of SiN film might be used with useful results. For example, a single layer of SiN may be deposited onto a flexible substrate that comprises an OLED in order to provide moisture resistance.

The invention has utility in the deposition of thin films of SiN. The SiN film may be a Thin Film Encapsulation (TFE) layer. However, the invention is not limited to any particular thickness of the deposited SiN film. For example, the thickness of the SiN film may be in the range 50 to 100 nm, 100 to 500 nm, 500 to 2000 nm, 2 to 5 microns, or any desired thickness or range of thicknesses.

According to a second aspect of the invention there is provided a flexible substrate having a SiN film deposited thereon in a method according to the first aspect of the invention.

Whilst the invention is described above, it extends to any inventive combination of the features set out above or in the following description, drawings, or claims.

BRIEF DESCRIPTION OF THE DRAWINGS

Embodiments of methods and substrates in accordance with the invention will now be described with reference to the accompanying drawings, in which.

DETAILED DESCRIPTION OF EMBODIMENTS

The invention relates to the deposition of SiN films onto various flexible substrates by Plasma Enhanced Chemical Vapour Deposition (PECVD). The PECVD processes of the invention utilise a combination of SiH$_4$, N$_2$ and H$_2$ as reaction gases. The film deposition processes are performed at relatively high SiH$_4$ flow rates of greater than 100 sccm and relatively low temperatures of 200° C. or less. PECVD is a well established deposition technique and, as explained above, it is well known to deposit SiN films by PECVD using a mixture of SiH$_4$, NH$_3$ and N$_2$. Accordingly, it is not considered necessary to provide a detailed explanation of PECVD apparatus and methods herein. Suitable PECVD apparatus are available commercially. For example, the Applicants themselves produce PECVD apparatus which can be used to deposit SiN films in accordance with the invention. These PECVD systems are commercialised by the Applicant under the brand name Delta®.

Experiments were performed on SiN films deposited by PECVD in accordance with the invention using a SiH$_4$, N$_2$ and H$_2$ reaction gas mixture (henceforth termed 'NH$_3$ free' SiN films). Additionally, comparison experiments were performed on SiN films deposited using conventional, prior art based PECVD processes with a SiH$_4$/NH$_3$/N$_2$ based process chemistry. SiN films produced using these conventional, prior art based PECVD processes will henceforth be termed 'NH$_3$ based' SiN films. Deposition rates and wafer temperatures for the different films tested are shown in Table 1.

Film flexibility was determined by depositing a range of NH$_3$ based and SiH$_4$/N$_2$/H$_2$ SiN films of the invention onto a polyimide tape, such as Kapton® tape. This was done by attaching the polyimide tape to the surface of a silicon wafer using the side of the tape that is provided with an adhesive coating.

Figure 1:
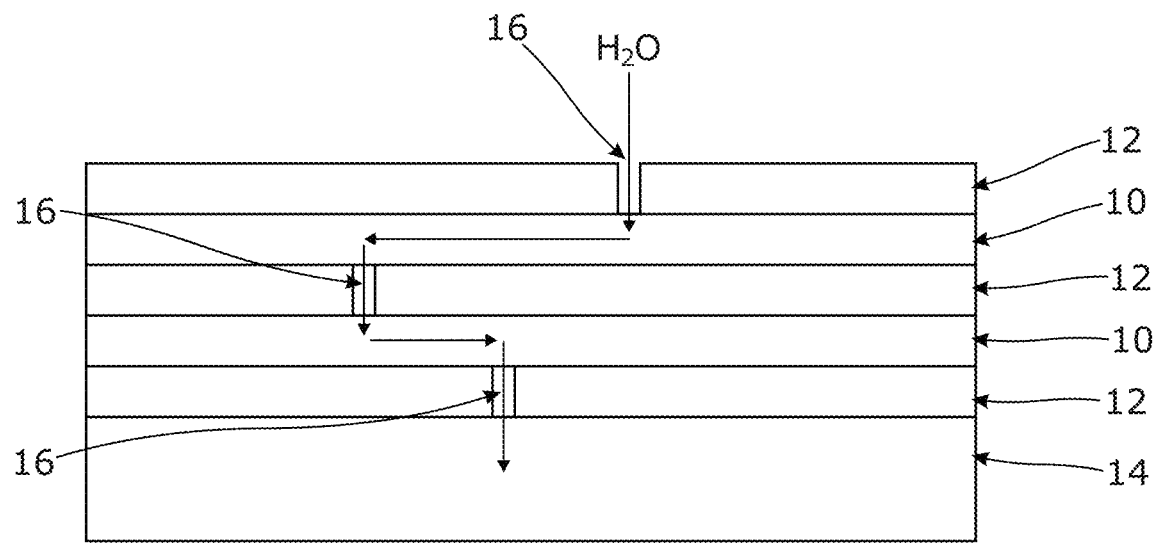
FIG. 1 is a cross section through a prior art OLED substrate having a plurality of interleaved SiN and organic polymer layers in which the moisture diffusion path is shown.
Figure 2:
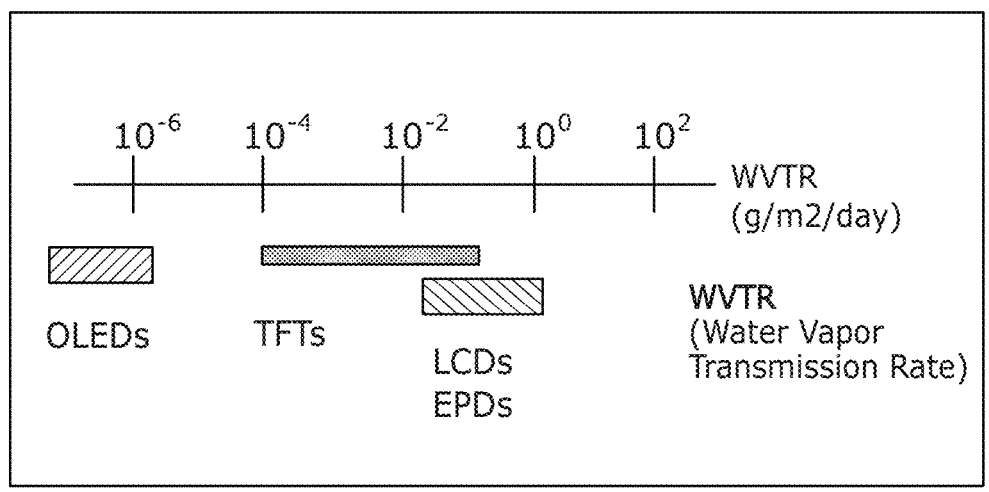
FIG. 2 shows Water Vapour Transmission Rate (WVTR) requirements for different products, including OLED devices.
Figure 3:
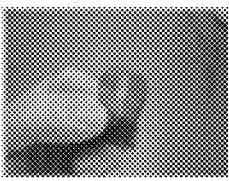
FIG. 3 shows flexibility tests performed on SiN films deposited on tape.
Figure 3:
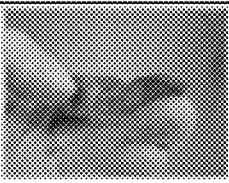
Figure 3:
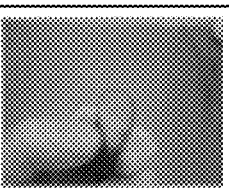
Figure 3:
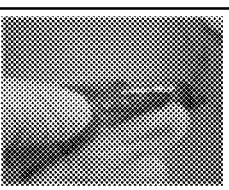
Figure 3:
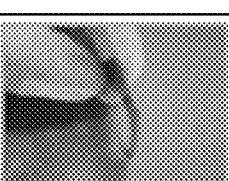

NH$_3$ based SiN films were deposited using a low deposition rate process and a high deposition rate process. SiN films of 100 nm and 1000 nm thickness were produced in order to investigate the effect of film thickness. The tape was flexed as shown in FIG. 3, and inspected using an optical microscope. Table 2 shows the results of these investigations, which indicate that the SiH$_4$/H$_2$/N$_2$ based PECVD SiN films of the invention have comparable flexibility to the NH$_3$ based SiN films.

Increasing the SiN film thickness reduces the risk of the SiN film cracking. For compressive 1000 nm thick NH$_3$ free SiN films, the flexibility is equivalent to industry standard NH$_3$ based SiN films.

Figure 4:
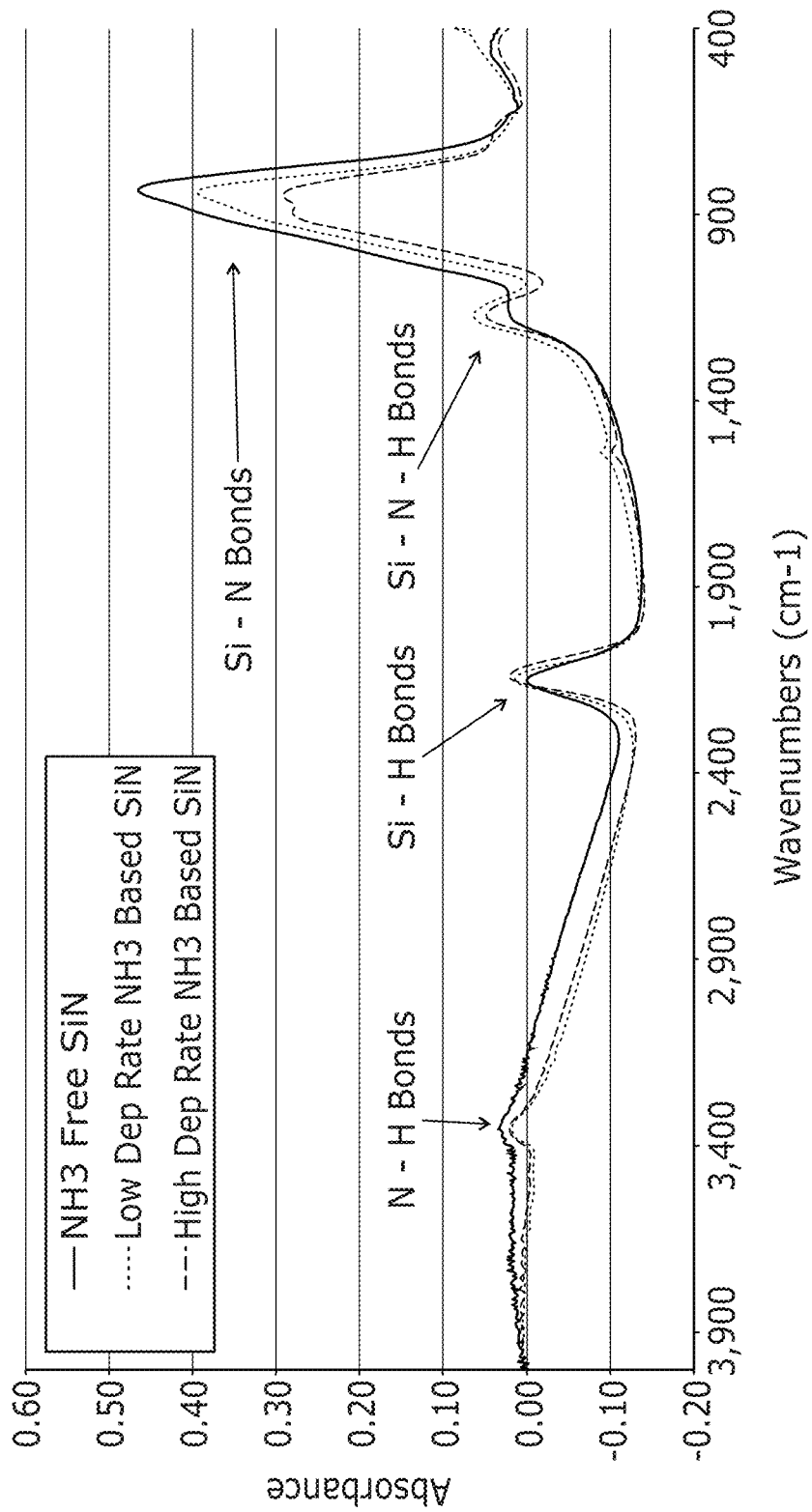
FIG. 4 shows FTIR spectra of low and high deposition rate prior art NH$_3$ based SiN films and a SiN film of the invention.
Figure 5A:
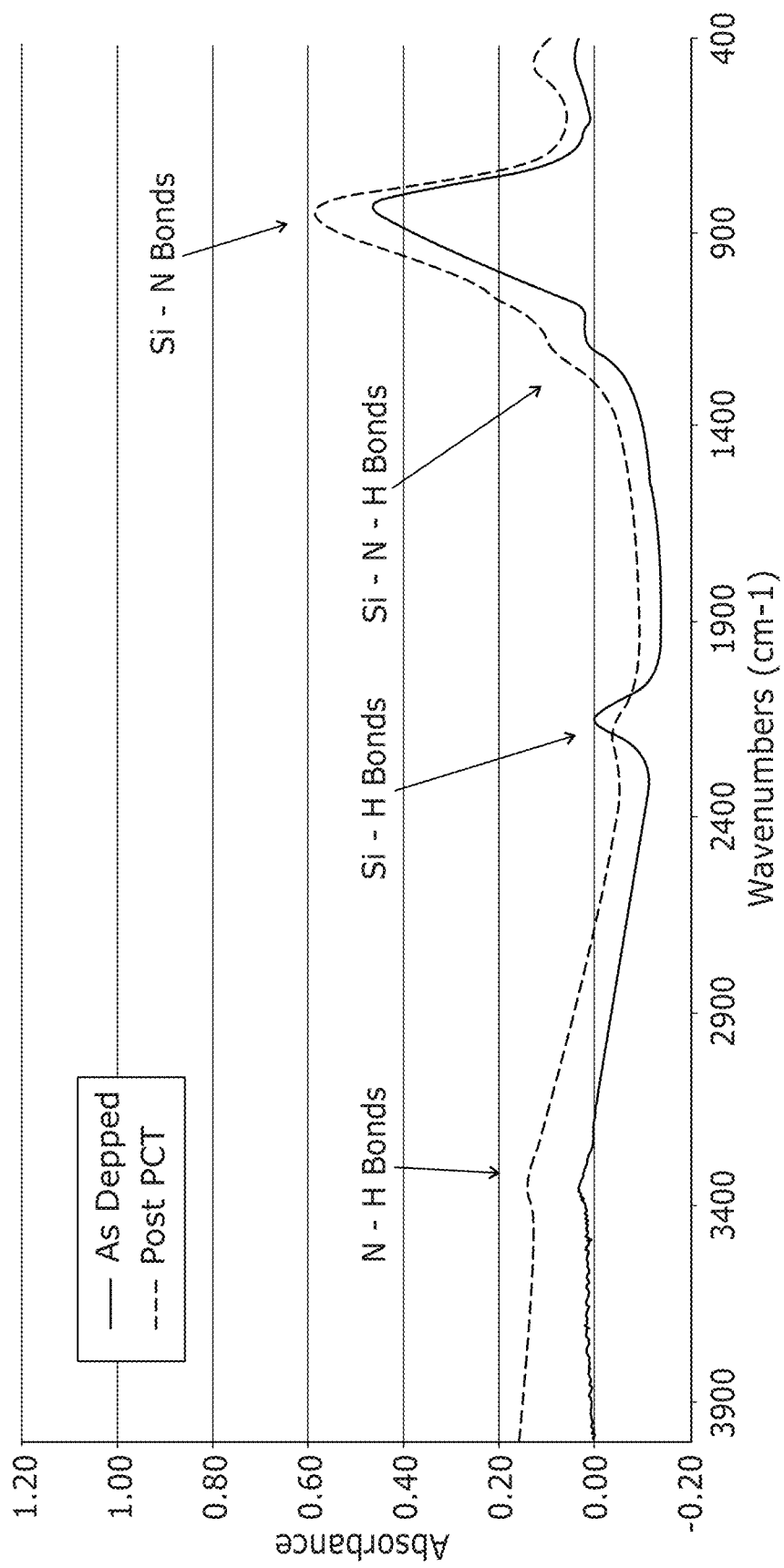
FIGS. 5(*a*), 5(*b*) and 5(*c*) shows FTIR spectra before and after a pressure cooker test for (a) a SiN film of the invention; (b) a low deposition rate prior art NH$_3$ based SiN film; and (c) a high deposition rate prior art NH$_3$ based SiN film, respectively.
Figure 5B:
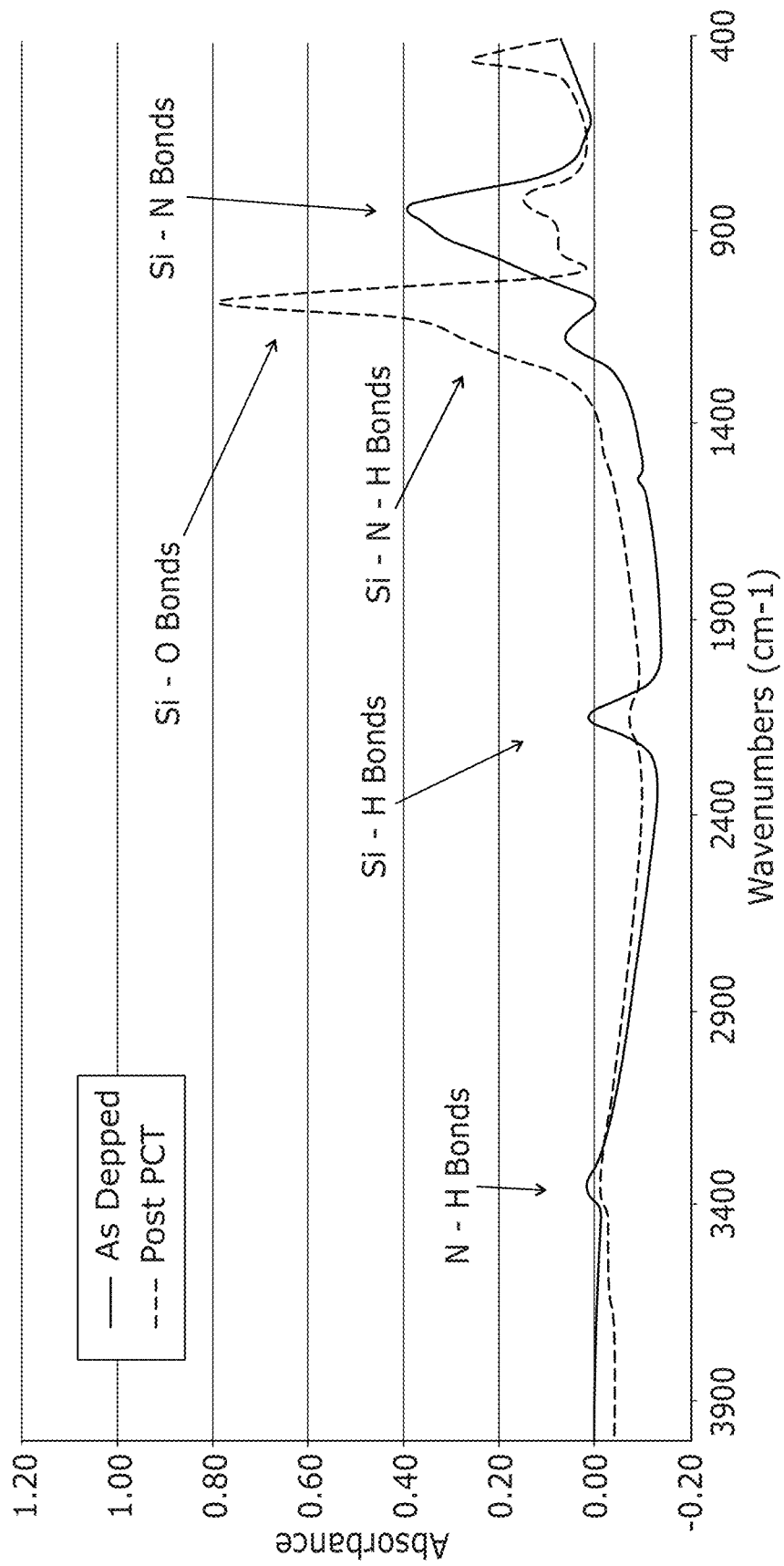
Figure 5C:
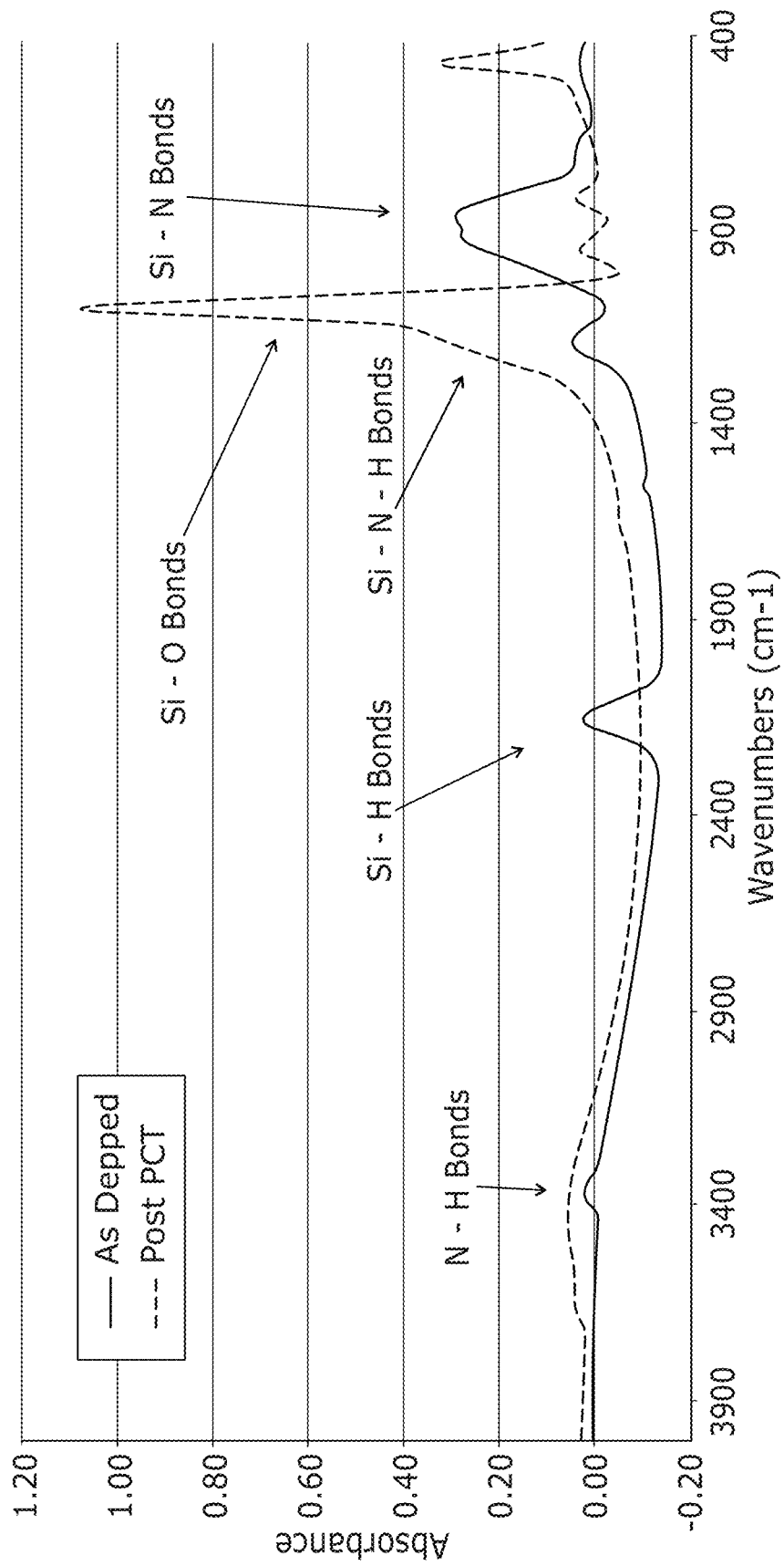
Figure 6A:
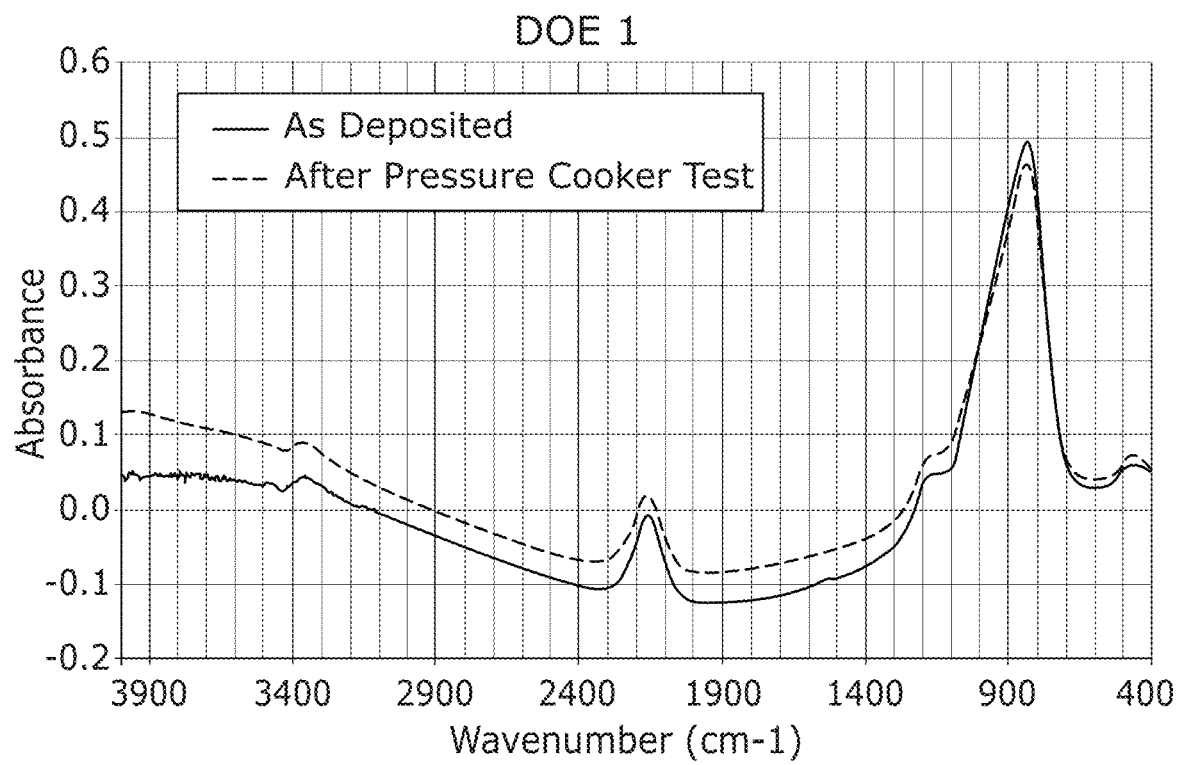
FIGS. 6(*a*), 6(*b*), 6(*c*), 6(*d*), 6(*e*), 6(*f*), 6(*g*) and 6(*h*) shows FTIR spectra before and after a pressure cooker test for films DOE 1-DOE 8.
Figure 6B:
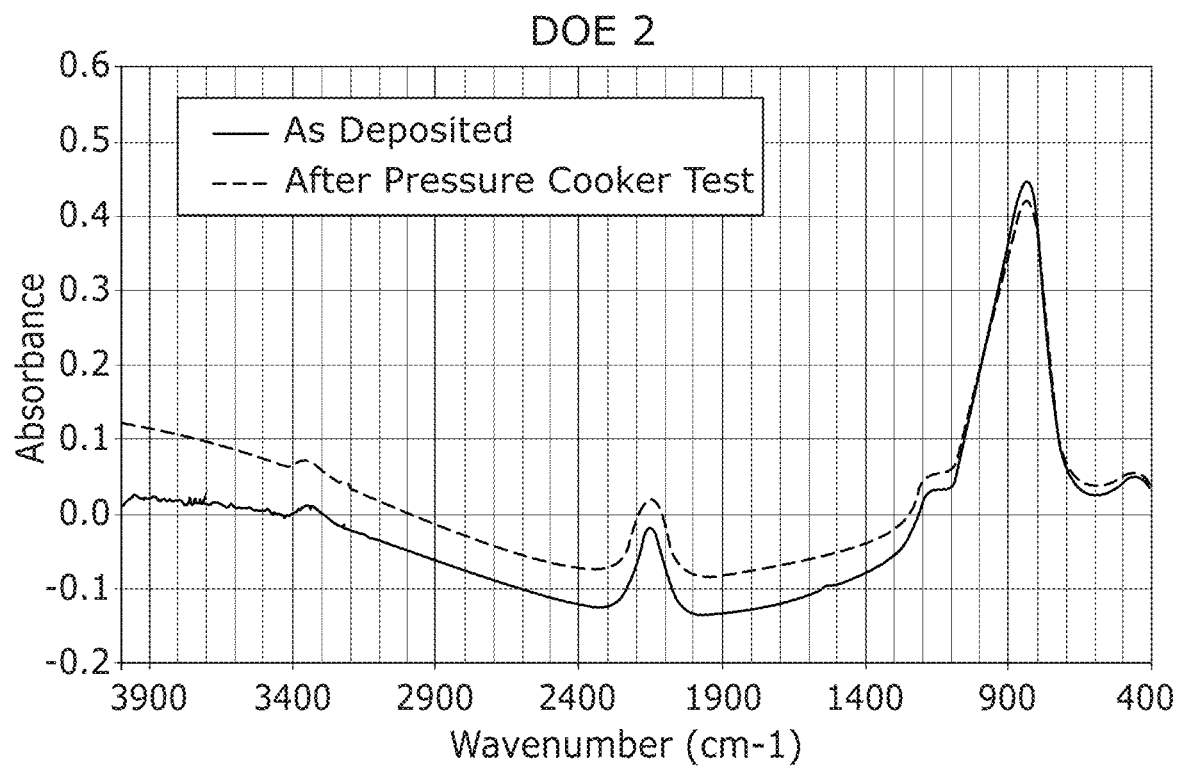
Figure 6C:
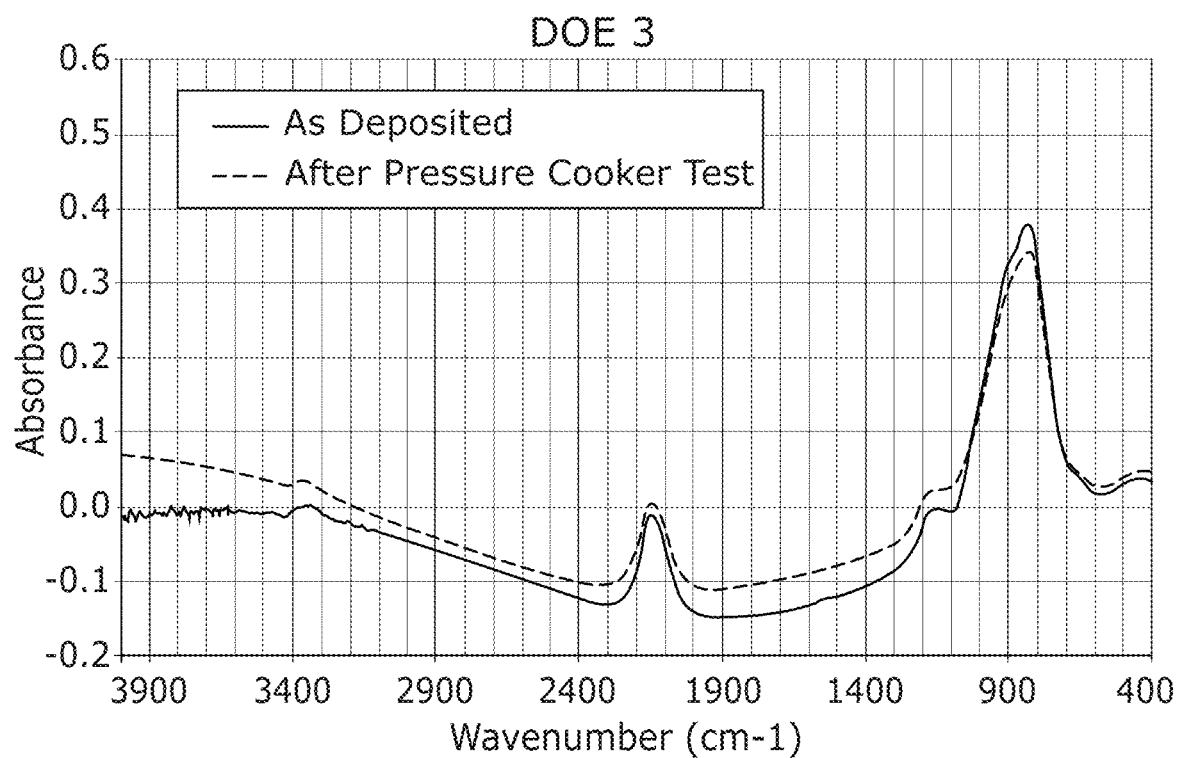
Figure 6D:
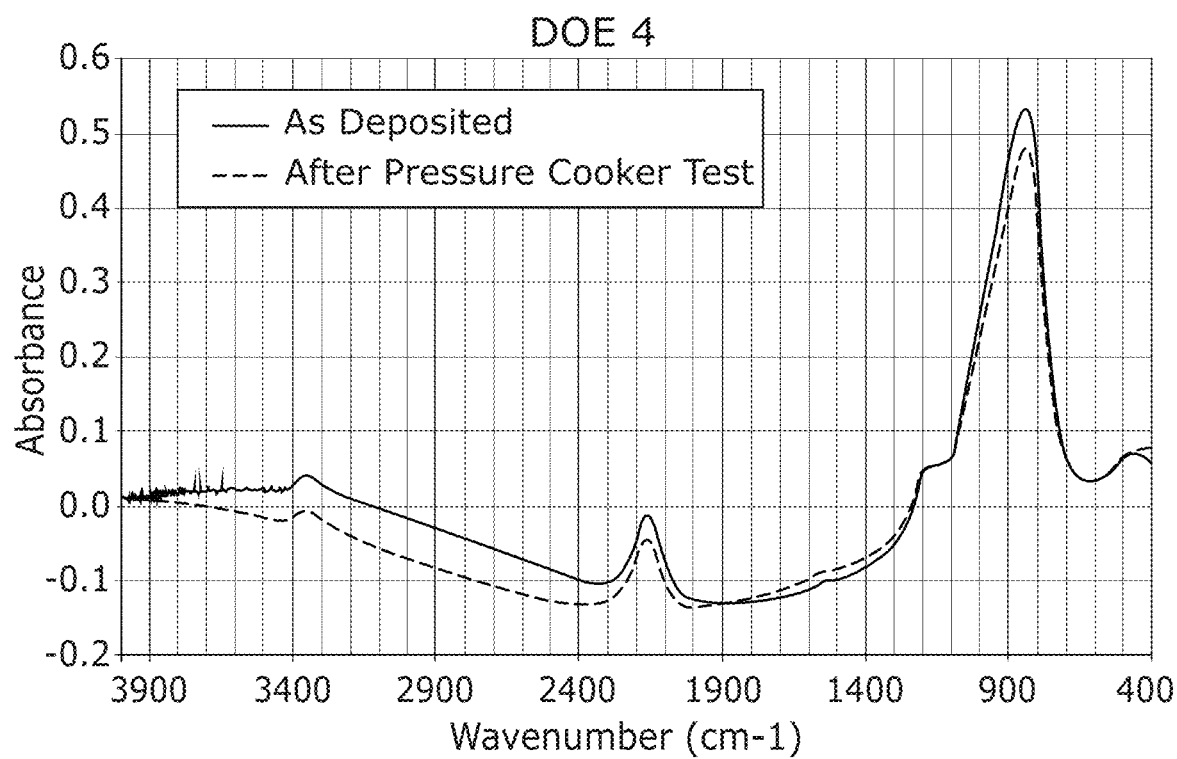
Figure 6E:
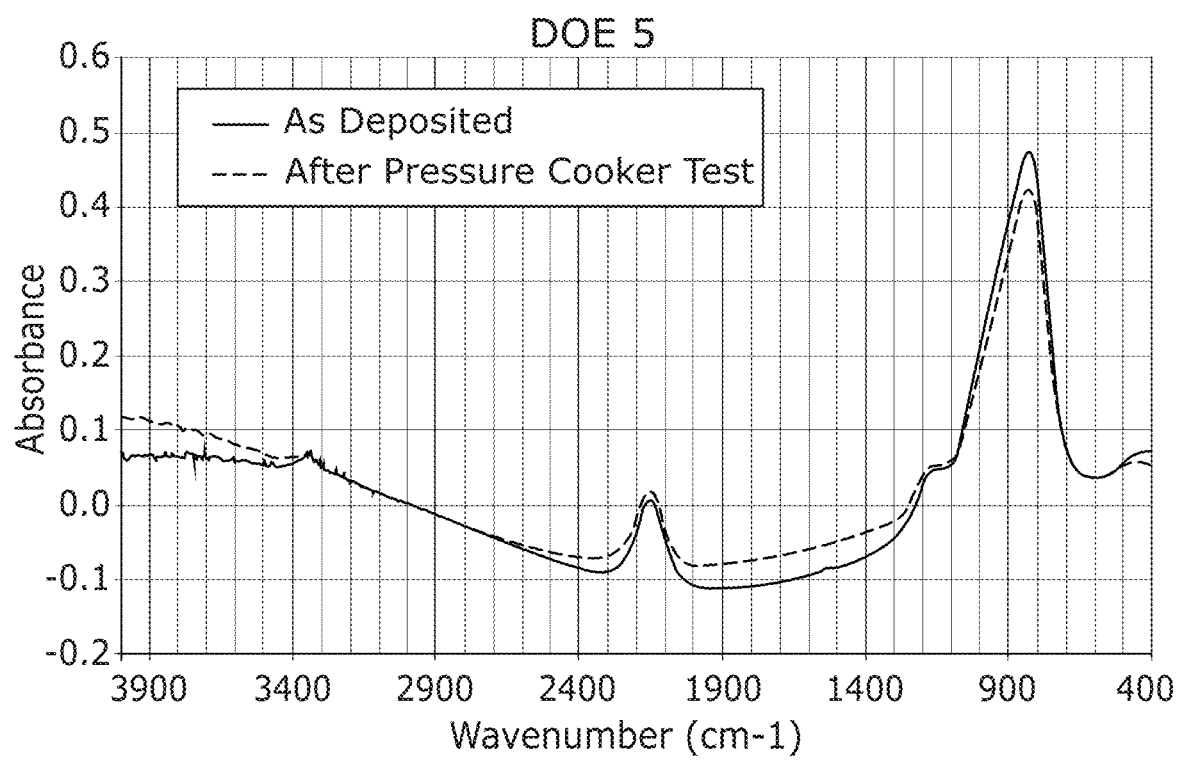
Figure 6F:
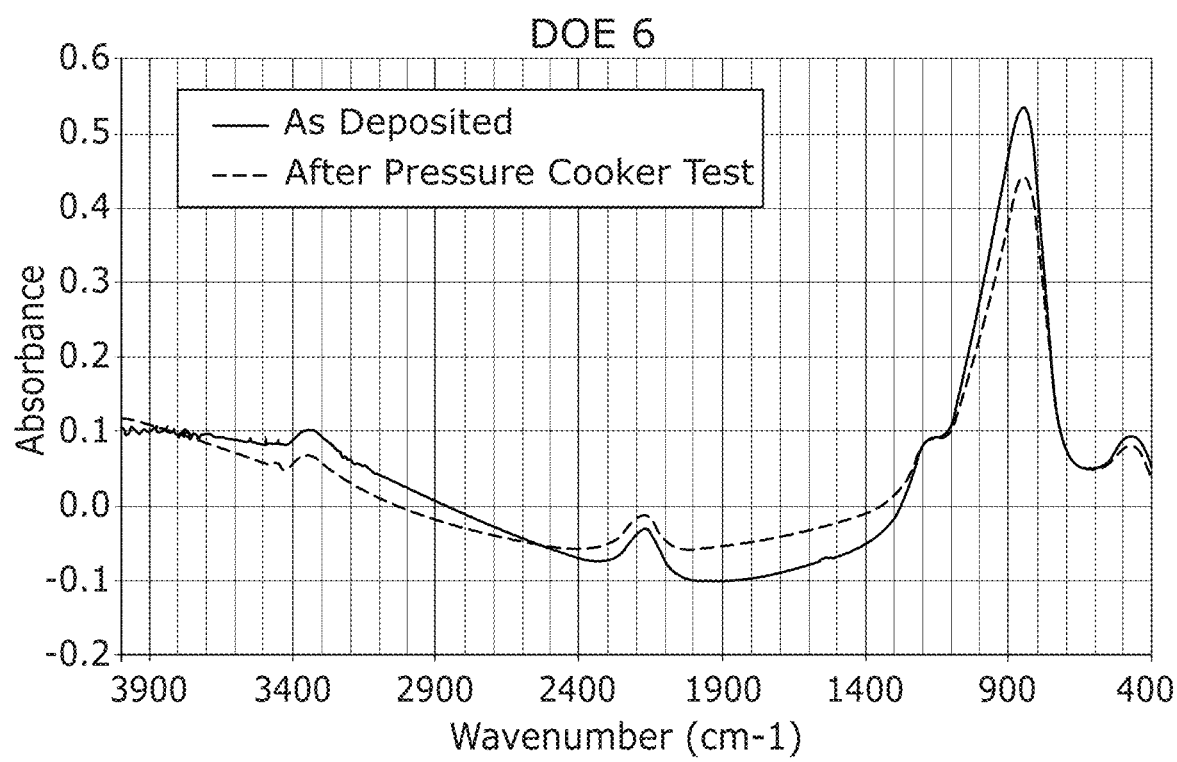
Figure 6G:
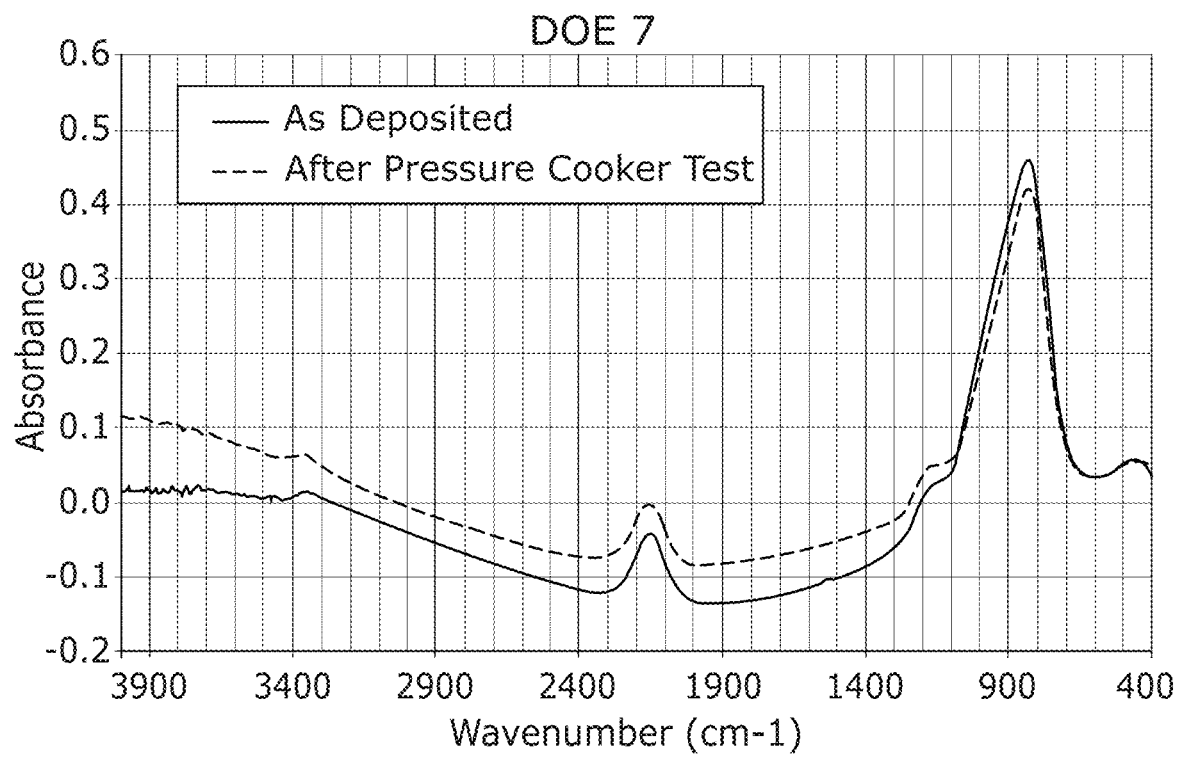
Figure 6H:
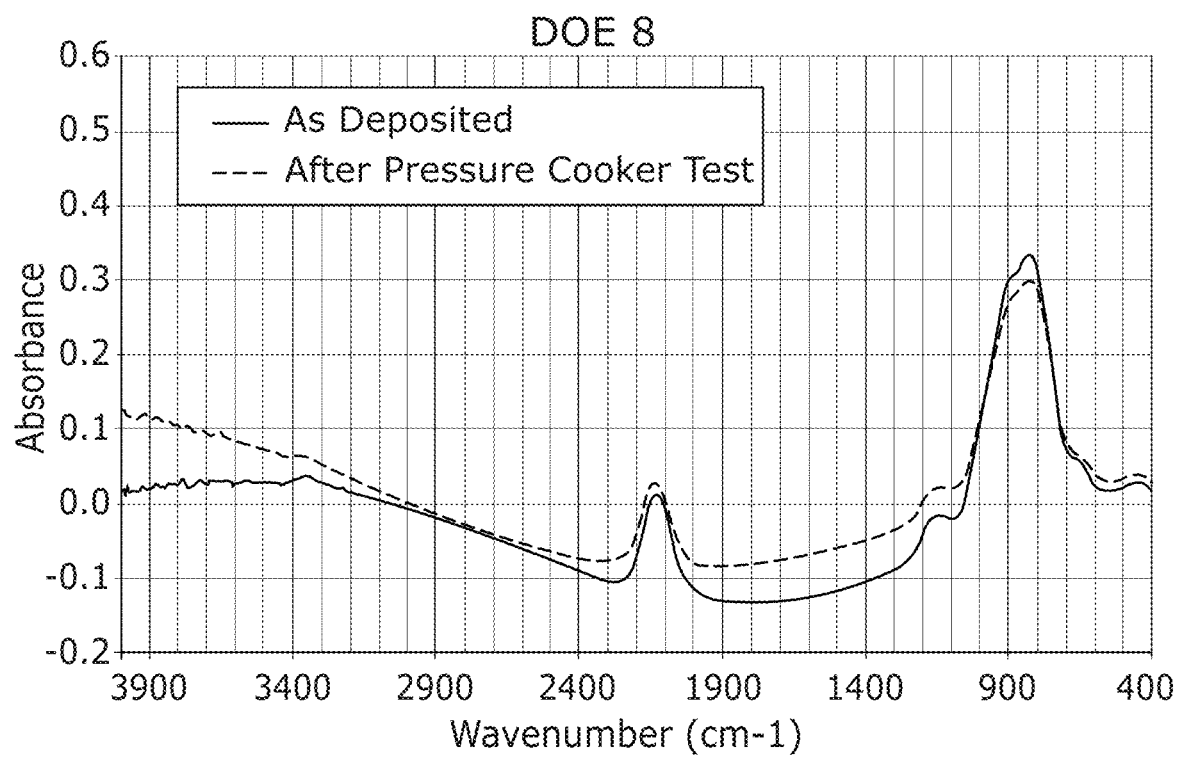

FIGS. 4 and 5 shows the results of FTIR analysis on NH$_3$ based SiN films and the SiN films of the invention. All of the SiN films analysed were of ~700 nm thickness. FTIR analysis determines moisture absorption in the films by monitoring characteristic bond excitations within the film. FIG. 4 shows that some differences between the different films are observed. These differences are related to the process chemistry used. Most noticeably, the Si—N—H peak is reduced for the SiN film of the invention compared to both NH$_3$-Based processes, and the high deposition rate NH$_3$-Based process displays a larger Si—N—H peak absorption than the low deposition rate NH$_3$-Based process. These differences are attributed to the amount of NH$_3$ in the process. The dissociation rate of NH$_3$ is much higher than for N$_2$ and H$_2$, resulting in more N and H available in the plasma, which is incorporated into the deposited film. Increasing the NH$_3$ flow increases the amount of Si—N—H bonds within the deposited film. By adding H$_2$ to this gas mix, as opposed to just N$_2$ or N$_2$/Ar, it is possible to achieve a SiN film with a low H content. The reduction in H content produces a denser SiN film with improved electrical properties (lower $-i_L$ (leakage current) and higher Vbd (voltage breakdown)). This is especially useful at low temperature (below 200° C.), where SiN films are required for passivation/encapsulation purposes.

FIG. 5 shows the results of FTIR analysis performed on ~700 nm thick SiN films as deposited, and after being subjected to a pressure cooker test at 120° C., 100 kPa (14.5 Psi) in de-ionised water, for 4 hours. This is an accelerated stress test which tests for moisture barrier performance. The FTIR analysis shows a clear change in Si—N and Si—O absorptions for the $NH_3$ based SiN films (FIGS. 5(b) and (c)). These results demonstrate that moisture has been reabsorbed during the pressure cooker test for the $NH_3$ based SiN films, resulting in Si—O type bonds where the oxygen has reacted with the Si within the film. In contrast, the $NH_3$ free film of the invention (FIG. 5(a)) shows no significant change in bonding within the film. This indicates that the $NH_3$ free film of the invention has not absorbed any significant quantities of water during the pressure cooker test.

It is concluded that the PECVD SiN films of the invention have significantly improved moisture barrier properties in comparison to the $NH_3$ based SiN films.

Moisture barrier, stress and flexibility to cracking for PECVD SiN films using $SiH_4/H_2/N_2$ at ~100° C. deposition temperature were investigated through a Design of Experiment (DOE) study that is summarized in Table 3. In the DOE study, various parameters associated with the $SiH_4/H_2/N_2$ PECVD process were varied and the effect of these variations on the above mentioned properties was examined. In Table 3, HF is high frequency, ES is electrode separation and RI is refractive index. A high frequency RF signal at 13.56 MHz was used to generate the plasma. It is possible to additionally use a low frequency RF component (typically 360-400 KHz), as is known in the art. It should be noted that the DOE 4 embodiment corresponds to the conditions used to produce the $NH_3$ free SiN films described above in relation to Tables 1 and 2.

FIG. 6 shows the results of FTIR analyses performed on 700 nm thick SiN films deposited in accordance with the DOE embodiments shown in Table 3 (albeit deposited for a longer time in order to produce a thicker film). The films were subjected to the pressure cooker test described above. No change is discerned in any of the bonds interrogated by the FTIR analysis (in particular the Si—N and Si—O absorption peaks) after the pressure cooker test, for any of the DOE SiN films. This indicates that there has been no reabsorption of moisture.

Flexibility testing was performed on 100 nm thick films deposited onto Kapton® tape. The results are shown in Table 4. All of the SiN films tested show good flexibility, but with the most challenging test (reverse fold), the best results are obtained for 100 nm films that have a stress in the range +60 MPa (Tensile) to −100 MPa (Compressive). These films passed all of the flexibility tests. Flexibility is related to film stress. Without wishing to be limited by any particular theory or conjecture, it is believed that outside of this range, the magnitude of the strain (stress) means the SiN lattice is either pulling apart (compressive stress) or pushing together (tensile stress) with a higher force than films within these limits. With the film in a (relatively) highly stress state, bowing or other flexional motion is more likely to damage the SiN lattice and cause the film to fracture/crack. Table 5 summarizes the process conditions for the films that successfully passed the flexibility tests in Table 4.

The parameters shown in Table 4 are non-limiting and the invention may be successfully performed using process parameters which fall outside of any of the ranges shown. For example, routine experimentation based on the information provided herein may indicate that other combinations of parameters give rise to similar flexibility properties. Also, flexibility properties are affected by other parameters and features, such as film thickness. It may be possible to use process parameters which lie outside of the ranges shown in Table 4 and compensate by adjusting other parameters and features, such as film thickness. Further, it is noted that the flexibility required of a SiN film will vary depending on the end application. With some applications, it may be acceptable to provide a SiN film which does not pass all of the tests described in relation to Tables 2 and 4.

SiN films in accordance with the invention can be deposited onto a range of flexible substrates, such as substrates comprising OLEDs and flexible solar cells. Although the SiN films of the invention are particularly useful as moisture barriers, they may be used for different purposes, such as a passivation layer which protects against the ingress of a corrosive agent other than water, or as a layer which protects against mechanical wear.

TABLE 1

Deposition Rate comparison for $NH_3$-Free and $NH_3$-Based films

| Description | $NH_3$ Free SiN | Low Deposition Rate $NH_3$ Based SiN | High Deposition Rate $NH_3$ Based SiN |
|---|---|---|---|
| Deposition Rate (nm · min$^{-1}$) | 387 | 38.4 | 699 |
| Wafer Temperature | 99-104° C. | 88-93° C. | 99-104° C. |

TABLE 2

SiN film flexibility versus film thickness

| | | P3 HDR $NH_3$ Free SiN | | P4 LDR $NH_3$ Based SiN | | P5 HDR $NH_3$ Based SiN | |
|---|---|---|---|---|---|---|---|
| | | Film Thickness | | | | | |
| | | 100 nm | 1000 nm | 100 nm | 1000 nm | 100 nm | 1000 nm |
| | | Stress | | | | | |
| Test | Description | 0 MPa | | −75 MPa | | −200 MPa | |
| 1 | Flex (SiN on inside of loop) | Ok | Ok | Ok | Ok | Ok | Ok |
| 2 | Twist (SiN on inside of twist) | Ok | Ok | Ok | Ok | Ok | Ok |

TABLE 2-continued

SiN film flexibility versus film thickness

| | P3 HDR NH₃ Free SiN | | P4 LDR NH₃ Based SiN | | P5 HDR NH₃ Based SiN | |
|---|---|---|---|---|---|---|
| | Film Thickness | | | | | |
| | 100 nm | 1000 nm | 100 nm | 1000 nm | 100 nm | 1000 nm |
| | Stress | | | | | |
| Test Description | 0 MPa | | −75 MPa | | −200 MPa | |
| 3 Reverse Flex (SiN on outside of loop) | Ok | Ok | Ok | Ok | Ok | Ok |
| 4 Reverse Twist (SiN on outside of twist) | Ok | Ok | Ok | Ok | Ok | Ok |
| 5 Fold (SiN on inside of fold) | Cracking | Ok | Cracking | Ok | Cracking | Ok |
| 6 Reverse Fold (SiN on outside of fold) | — | Ok | — | Ok | — | Ok |

TABLE 3

DOE process minimum/maximum limits and film responses

| Film Designation | SiH₄ (sccm) | H₂ (sccm) | N₂ (sccm) | Pressure (mT) | HF RF (W) | ES (mm) | Dep Time (sec) | Dep Rate (nm/min) | Thickness (Å) | %1σ | % mm | RI | RI Rng (±) | Stress (MPa) |
|---|---|---|---|---|---|---|---|---|---|---|---|---|---|---|
| DOE 1 | +15% | +15% | −15% | +15% | −15% | +4% | 16 | 278.6 | 743 | 1.37 | 2.66 | 1.9141 | 0.0133 | 557 |
| DOE 2 | −15% | −15% | −15% | +15% | +15% | −8% | 16 | 442.5 | 1180 | 1.44 | 3.47 | 1.8917 | 0.0136 | 156 |
| DOE 3 | −15% | −15% | +15% | −15% | −15% | +4% | 16 | 440.6 | 1175 | 1.59 | 2.55 | 2.0028 | 0.0204 | −10 |
| DOE 4 | 318 | 350 | 4125 | 2000 | 700 | 24 | 16 | 372.4 | 993 | 1.57 | 2.82 | 1.8927 | 0.006 | 58 |
| DOE 5 | +15% | −15% | +15% | +15% | −15% | −8% | 16 | 298.5 | 796 | 0.88 | 2.49 | 1.9318 | 0.0016 | 13 |
| DOE e | +15% | −15% | −15% | −15% | +15% | +4% | 30 | 317.6 | 1588 | 1.35 | 2.11 | 1.888 | 0.0059 | −5 |
| DOE 7 | +15% | +15% | +15% | −15% | +15% | −8% | 16 | 372.8 | 994 | 2.84 | 4.11 | 1.983 | 0.0283 | −103 |
| DOE 8 | −15% | +15% | −15% | −15% | −15% | −8% | 16 | 464.6 | 1239 | 2.14 | 3.2 | 2.0895 | 0.0016 | −601 |

TABLE 4

Process Design of Experiment: Flexibility results for 100 nm PECVD SiN films using SiH₄, H₂ and N₂. Descriptions are the same as in table 2.

| Description | DOE 1 | DOE 2 | DOE 3 | DOE 4 | DOE 5 | DOE 6 | DOE 7 | DOE 8 |
|---|---|---|---|---|---|---|---|---|
| Stress (MPa) | 557 | 156 | −10 | 58 | 13 | −5 | −103 | −601 |
| Flex | Pass | Pass | Pass | Pass | Pass | Pass | Pass | Pass |
| Twist | Pass | Pass | Pass | Pass | Pass | Pass | Pass | Pass |
| Reverse Flex | Pass | Pass | Pass | Pass | Pass | Pass | Pass | Pass |
| Reverse Twist | Pass | Pass | Pass | Pass | Pass | Pass | Pass | Pass |
| Fold | Fail | Pass | Pass | Pass | Pass | Pass | Pass | Fail |
| Reverse Fold | Fail | Fail | Pass | Pass | Pass | Pass | Pass | Fail |

TABLE 5

Process parameter range for flexible PECVD SiN films using SiH₄, H₂ and N₂.

| Process Parameter | Range | Preferred Values |
|---|---|---|
| SiH₄ Flow Rate (sccm) | 270-365 | 290-318 |
| H₂ Flow Rate (sccm) | 300-400 | 350-370 |
| N₂ Flow Rate (sccm) | 3500-4750 | 4125-4350 |
| Pressure (mT) | 1700-2300 | 1800-2000 |
| HF (13.56 MHz) RF Power (watts) | 600-800 | 650-750 |
| Temperature (° C.) | 90-120 | 99-104 |
| Electrode Gap (mm) | 20-35 | 22-24 |

What is claimed is:

1. A method of depositing a SiN film onto a flexible substrate comprising the steps of:

providing the flexible substrate; and depositing the SiN film onto the flexible substrate in a plasma enhanced chemical vapour deposition (PECVD) process comprising $SiH_4$, $N_2$ and $H_2$ and in an absence of $NH_3$ at a pressure from 1700 to 2300 mT, in which the temperature of the substrate is 200° C. or less and $SiH_4$ is introduced into the PECVD process at a flow rate of greater than 100 sccm.

2. The method according to claim 1 in which the flexible substrate comprises an OLED.

3. The method according to claim 2 in which the flexible substrate is an active matrix (AMOLED) device.

4. The method according to claim 1 in which the flexible substrate is a flexible solar cell.

5. The method according to claim 1 in which $SiH_4$ is introduced into the PECVD process at a flow rate of greater than 200 sccm.

6. The method according to claim 5 in which $SiH_4$ is introduced into the PECVD process at a flow rate in the range 270 to 370 sccm.

7. The method according to claim 6 in which $SiH_4$ is introduced into the PECVD process at a flow rate in the range 290 to 320 sccm.

8. The method according to claim 1 in which $H_2$ is introduced into the PECVD process at a flow rate in the range 300 to 400 sccm.

9. The method according to claim 8 in which $H_2$ is introduced into the PECVD process at a flow rate in the range 350 to 370 sccm.

10. The method according to claim 1 in which $N_2$ is introduced into the PECVD process at a flow rate of greater than 2000 sccm.

11. The method according to claim 10 in which $N_2$ is introduced into the PECVD process at a flow rate in the range 3500 to 4750 sccm.

12. The method according to claim 11 in which $N_2$ is introduced into the PECVD process at a flow rate in the range 4100 to 4400 sccm.

13. The method according to claim 1 in which the temperature of the flexible substrate is 150° C. or less.

14. The method according to claim 13 in which the temperature of the flexible substrate is in a range from 90 to 120° C.

15. The method according to claim 14 in which the range is from 95 to 105° C.

16. The method according to claim 1 in which the PECVD process is performed in a mixture of gases which consists of $SiH_4$, $N_2$ and $H_2$.

17. The method according to claim 1 in which the mixture of gases further comprises at least one diluent gas.

18. The method according to claim 17 in which the diluent gas is a Noble gas.

19. The method according to claim 18 in which the Noble gas is Argon or Helium.

20. The method according to claim 1 in which $SiH_4$ is introduced into the PECVD process at a flow rate from 290 to 318 sccm, $H_2$ is introduced into the PECVD process at a flow rate from 350 to 370 sccm, and $N_2$ is introduced into the PECVD process at a flow rate from 4125 to 4350 sccm.

* * * * *